United States Patent [19]

Baumgartner et al.

[11] Patent Number: 5,288,519

[45] Date of Patent: Feb. 22, 1994

[54] METHOD OF PRODUCING MODIFIED POLYIMIDE LAYER HAVING IMPROVED ADHESION TO METAL LAYER THEREON

[75] Inventors: Charles E. Baumgartner, Schenectady, N.Y.; Lisa R. Scott, Chicago, Ill.

[73] Assignee: General Electric Company, Schenectady, N.Y.

[21] Appl. No.: 874,458

[22] Filed: Apr. 27, 1992

[51] Int. Cl.$^5$ ............................................. B05D 3/00
[52] U.S. Cl. ..................... 427/304; 427/305; 427/306; 427/341; 427/380; 427/404; 427/412.1; 427/443.1; 205/167; 205/169
[58] Field of Search ............. 427/340, 412.1, 443.1, 427/304, 305, 306, 380, 404, 341; 428/458; 205/167, 169, 177, 181, 182

[56] References Cited

U.S. PATENT DOCUMENTS

| | | | |
|---|---|---|---|
| 3,011,920 | 12/1961 | Shipley, Jr. | 117/213 |
| 3,841,881 | 10/1974 | Feldstein et al. | 106/1 |
| 3,974,324 | 8/1976 | Lupinski et al. | 428/458 |
| 4,111,906 | 9/1978 | Jones et al. | 528/229 |
| 4,203,922 | 5/1980 | Jones et al. | 260/570 R |
| 4,515,829 | 5/1985 | Deckert et al. | 427/97 |
| 4,515,829 | 5/1985 | Decker et al. | 427/97 |
| 4,522,880 | 6/1985 | Klostermeier et al. | 428/332 |
| 4,555,315 | 11/1985 | Barbieri et al. | 204/52 R |

FOREIGN PATENT DOCUMENTS 0272420 11/1987 France .

OTHER PUBLICATIONS

Kirk–Othmer, Encylopedia of Chemical Technology, Third Edition, vol. 8, 1978–Wiley–Interscience–Wayne A. McRae, Research Ionics, Ind.–Electroless Plating–pp. 738–750.

Kirk–Othmer, Encylopedia of Chemical Technology, Third Edition, vol. 8, 1978–Wiley–Interscience–Nikolaus E. Wolff, Consultant, Hanover, N.H., John W. Weigl, Xerox Corp.–Electroplating–pp. 826–869.

E. I. Monthly No:E18907061713, Thermal Properties of EYMYD Polyimides, R. J. Jones and E. M. Silverman–TRW Space & Technology Group, Redondo Beach, Calif.–SAMPE Journal v 25 n 2, Mar.–Apr. 1989, pp. 41–44.

*Primary Examiner*—Anthony McFarlane
*Assistant Examiner*—P. Achutamurthy
*Attorney, Agent, or Firm*—William H. Pittman

[57] ABSTRACT

Method of producing a modified polyimide layer to improve adhesion of a metal layer thereon. A limited quantity of water is added to a halogenated polyamic acid to form a reaction product, which is then sprayed, degreased, oxidized and cured into a modified polyimide layer. The chemically modified surface by the aforementioned method is then electrolessly plated with a primary metal layer followed by one or more electrolessly or electrolytically applied secondary metal layers until the metal layer of a desired thickness is attained. The present invention further discloses articles such as an EMI shielded enclosure and an insulated mold surface, having metal layers as an EMI shield and an insulating surface, respectively.

22 Claims, No Drawings

METHOD OF PRODUCING MODIFIED POLYIMIDE LAYER HAVING IMPROVED ADHESION TO METAL LAYER THEREON

CROSS REFERENCE TO RELATED APPLICATIONS

Reference is made to a commonly assigned co-pending application Ser. No. 07/968,565 filed on Sep. 26, 1991 for Method of Treating Halogenated Polyimide Substrates and Articles Obtained Therefrom, and to commonly assigned concurrently filed applications for Halogenated Polyimide Composition Having Improved Adhesion Characteristic and Articles Obtained Therefrom, Ser. No. 07/874,453 and Method of Treating Halogenated Polyimide Substrates For Increasing Adhesion of Metal Layer Thereon, Ser. No. 07/874,448, all incorporated herein by reference.

FIELD OF THE INVENTION

The present invention is directed to improved methods of plating metal on a polyimide surface, and particularly to improvements in the adhesion of metal layers on halogenated polyimide surfaces.

BACKGROUND OF THE INVENTION

One aspect of the present invention is directed to an insulation layer used in plastic molding applications. Recent improvements in the molding of plastic parts include providing a multilayer composite mold structure in which a thermally conductive core or a cavity, e.g., a metal core or cavity, is covered with an insulating layer, generally of a polymer, over which a hard skin metal layer is provided for improving the surface characteristics of a molded article made from such a mold structure. The purpose of the insulating layer is to slow the cooling of the thermoplastic material sufficiently so that heat from the plastic material remains within the polymer melt for a period of time sufficient to prevent formation of voids, die lines, folds and other surface defects created during the solidification of the plastic melt. Otherwise, the plastic material which comes in contact with the relatively cool surface of the mold core, quickly solidifies and the surface defects are frozen in place on the molded article surface. Such an insulating layer is sometimes also known as a thermally engineered multilayered insulated structure (TEMIS) mold surface.

The present invention recognizes a problem that exists in injection molding processes employing thermal insulation layers of the type discussed above. In particular, where a metal skin is employed over the insulation layer to improve the surface characteristics of a finished article, delamination may occur at the interface of the metal skin and the underlying insulation layer, especially near areas adjacent to the gate through which molten polymer is injected into the mold cavity. The present invention is directed to improving the adhesion of the metal skin to the underlying insulation layer.

Another aspect of the present invention is directed to metallized polymer substrates used in various industries. Ever since structural plastics have replaced metal in the enclosures used in electrical appliances, microwave ovens, business machines, and other electrical/electronic products, manufacturers have had to overcome problems caused by electromagnetic interference (EMI) in general and radio frequency interference (RFI) in particular. The Federal Communications Commission (FCC), since 1983, requires that the electrical products not exceed certain specified EMI/RFI levels. The FCC requirements have been codified in the FCC regulation CRF 47, Part 15, Subsection J. The FCC requirements are met by reducing the EMI/RFI emission from the electrical/electronic products by providing a shielding. With the increased sensitivity of newer, higher-speed, and higher-frequency circuits plus a continued proliferation of electronic devices worldwide, EMI shielding problems are becoming more demanding. This has placed greater emphasis on high signal attenuation by the shielding medium.

The EMI shielded enclosures are also used to protect delicate electronic/electrical circuitry and components enclosed within the enclosure from damage by external sources such as static electricity or man-made high intensity EMI emissions.

Enclosures having metal cases, metal foil claddings, wire mesh screens, applied coatings, magnetic materials, and a variety of alternative approaches have been tried. However, because of their cost advantages and superior performance, plastic enclosures having metallized coatings have emerged as the dominant choice.

Several attempts have been made to increase the adhesion of a conductive metal layer to halogenated polyimide substrates. One of the prior art methods for improving adhesion involves grit blasting the surface to provide a roughened profile on which the subsequently-applied metals can be anchored. Other methods call for the use of chemical swelling agents or penetrants to swell the surface prior to the application of a metal layer.

While such methods do increase adhesion, they are often not entirely satisfactory for several reasons. Such techniques often result in physical degradation of the halogenated polyimide surface thereby decreasing the tensile as well the impact strength of the underlying halogenated polyimide substrate. The aforementioned physical degradation results from the swelling and cracking steps to which the entire substrate material is exposed. Additionally, such surface preparations can cause crack formation and propagation at highly stressed areas such as at sharp corners or edges of the enclosure being shielded.

SUMMARY OF THE INVENTION

The present invention is directed to a method of improving adhesion of a metal layer on a halogenated polyimide surface comprising, reacting a halogenated polyamic acid with about 0.1 to about 14.0% by weight of water to form a reaction product, applying a coating of the reaction product over the surface of a substrate, curing the reaction product coating into a layer of the halogenated polyimide, treating the surface of the polyimide layer with a degreasing agent, and treating the degreased surface with an oxidizing agent.

The present invention further includes articles such as an insulated mold surface and an EMI shielded enclosure having metal layers as an insulating surface and an EMI shield, respectively.

DETAILED DESCRIPTION OF THE PREFERRED EMBODIMENT

The present invention is directed to a method of preparing a halogenated polyimide surface having improved adhesion to a metal layer deposited on the surface. Generally an adhesive bond between the metal layer and the surface of the underlying substrate is established by interfacial molecular contact between the metal layer and the surface.

The polymeric surface used in the present invention is of a modified halogenated polyimide. A modified fluorinated polyimide is preferred. The term "surface" or "modified halogenated polyimide surface" means a surface of a halogenated polyimide substrate that may be in the form of an article such an insulated mold surface or an EMI shielded enclosure.

The halogenated polyimide by the method of the present invention is produced by modifying a partially halogenated polyamic acid known in the art. A typical structure of a known partially halogenated polyamic acid is as follows:

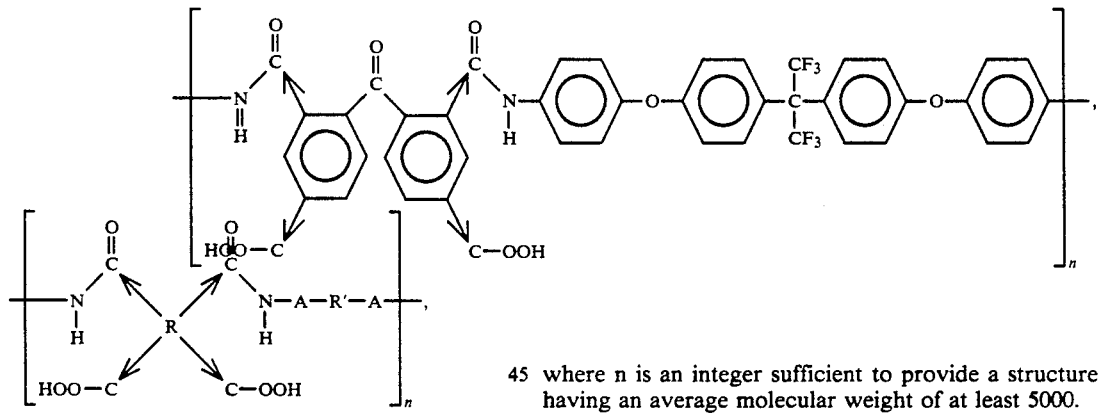

where R' is a halogenated alkyl group, A is a substituted or unsubstituted phenylene or diphenyl ether group, and R is an organic group of 5 to 50 carbon atoms. The organic group R may be an unsubstituted or halogen substituted aliphatic, alicyclic, aromatic, heteroaliphatic, heteroalicyclic, heteroaromatic radical or combinations thereof. The aforementioned hetero radical of the organic group R contains oxygen or oxygen and sulfur atoms and the aromatic or the heteroaromatic radical has one or more benzene or fused polynuclear rings and the halogenated alkyl group R' is preferably fluorinated. The organic group R having an aromatic radical is preferred. The arrows on the bonds of the organic group R signify that the aforementioned polyamic acid structure includes its various positional isomers.

A most preferred embodiment of the partially halogenated polyamic acid includes the product of a condensation reaction of substantially equal molar amounts of aromatic dianhydride and aromatic diamine. More specifically 2,2-bis[4-(4-aminophenoxy)phenyl]hexafluoropropane, a four ring aromatic diamine designated as 4-BDAF having the following structure:

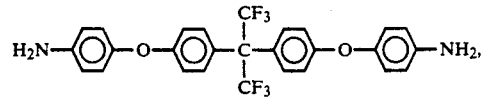

is reacted at a 1:1 stoichiometry with pyromellitic dianhydride (PMDA) to form a partially fluorinated precursor resin commercially designated as L-30N resin, having the following structure,

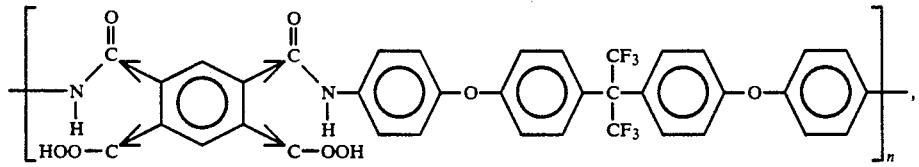

where n is an integer sufficient to provide a structure having an average molecular weight of at least 5000.

Another partially halogenated polyamic acid suitable for use in the present invention is prepared when 4-BDAF is reacted at a 1:1 stoichiometry with benzophenone tetracarboxylic acid dianhydride (BTDA) to form a partially fluorinated polyamic acid commercially designated as L-20N resin having the structure of, where n is an integer sufficient to provide a structure having an average molecular weight of at least 5000.

Both L-30N and L-20N precursor resins are manufactured by Ethyl Corporation under the trademark EYMYD®. The aforementioned EYMYD® polyimide resins are described more fully in U.S. Pat. Nos. 4,111,906 and 4,203,922, both of which are incorporated herein by reference. The EYMYD® resin is a polyamic acid precursor in a 1-methyl-2-pyrrolidinone (NMP) solvent and is a brown, varnish-like solution. Solvent evaporation and curing of the polyamic acid results in formation of a fluorine containing polyimide. Applying the EYMYD® resin to a surface followed by solvent removal and curing produces a high quality polyimide coating with an excellent thermal and oxidative stability, adhesion, and frictional wear. Reference is also made to SAMPE Journal, pages 41-44, Volume 25, No. 2, March/April 1989 for a further description of the EYMYD® polyimides.

The aforementioned halogenated polyimides may contain various amounts of fillers or reinforcing agents such as talc, mica, aluminum silicate, zinc oxide, titanium dioxide, carbon black, glass fibers, glass spheres, carbon fibers and mixtures thereof. In addition to the aforementioned fillers, the halogenated polyimides also can contain additional additives such as pigments, ultraviolet radiation absorbing agents, impact modifiers, plasticizers, microwave absorbing agents, stabilizers, processing aids, and anti-static agents.

The composition of the halogenated polyimide polymer of the present invention comprises an imidized form of the reaction product of the aforementioned partially halogenated polyamic acid when reacted with a limited quantity of water. When polyamic acid is subjected to heat, the carboxylic and amide groups present in each of its unit react and lose water. As a result, polyamic acid is converted into its imidized form. About 0.1 to about 14% by weight of water per weight of polyamic acid is added to the polyamic acid about 5 minutes to about 8 hours, preferably about 30 to 60 minutes, before its application to the surface of a desired substrate. It is believed that a partial hydrolysis of the polyamic acid takes place and, up to about 3% of the polyamic acid molecules are cleaved, such that one cleaved end of the aforementioned partially halogenated polyamic acid molecules is terminated with a dicarboxylic acid group and the other end is terminated with an amine group. The reaction product of the halogenated polyamic acid and water upon cure is polymerized into a modified halogenated polyimide.

The aforementioned modification to the partially halogenated polyamic acid was unexpectedly discovered when some sample metal plaques were sprayed with a conventional halogenated polyamic acid that had been accidentally contaminated by the moisture present in the airline connected to the sprayer. When the aforementioned plaques were cured and metallized through the conventional steps, the adhesion strength of the metal layer to the surfaces of these plaques was found to be significantly higher than expected. Upon further analysis, a second study was conducted in which, water was deliberately added to a conventional halogenated polyamic acid, prior to curing and metallization. The second study confirmed the previously noticed high adhesion values.

The presence of the amine and the dicarboxylic acid groups within the surface thickness of about 5,000 Å was confirmed by the attenuated total reflectance infrared spectroscopic studies (ATR) performed by a Fourier transform infrared spectrophotometer, Model No. 7199, made by Nicolet Instrument Corporation, Madison, Wis. It is believed that the chain ends of the cleaved polymer molecules terminated with the amine and dicarboxylic groups tend to migrate to the surface. These groups are believed to interact with metal to form complexes or compounds. As a result, metal molecules can adhere more strongly on the modified halogenated polyimide surface than the surface of a conventional halogenated polyimide layer. It is further believed that the chain ends of the cleaved polymer molecules terminated with the amine group tend to migrate to the surface more often than the chain ends terminated with the dicarboxylic group and a further improvement in metal adhesion is believed to occur as a consequence thereof.

The halogenated polyimide layer of the most preferred embodiment is derived by curing a reaction product of the L-30N EYMYD ® precursor resin and water since maximum adhesion to a metal layer is provided by imidization of such a reaction product.

The reaction product of the halogenated polyamic acid and water may be diluted to a sprayable solution suitable for spray coating on the surface of a suitable substrate, by adding one part of the reaction product to 4 parts of a solvent solution containing a mix of about 95% by weight of MEK (methylethylketone) with about 5% by weight of NMP. The sprayable solution is generally sprayed on the surface of the desired substrate maintained at about 80° C. to about 150° C., preferably at about 104° C. It should be noted that most of the MEK solvent is evaporated at this stage. The temperature of the coating of the reaction product of polyamic acid and water is increased at a steady rate (ramped) from the aforementioned spray temperature to a cure temperature of about 205° C. to 250° C., preferably about 240° C., in about 1 to about 4 hours, preferably in about 2 hours. It should be noted that most of the NMP solvent is evaporated at this stage. The reaction product coating is then cured for about 2 to about 8 hours, preferably for about 2 hours. During the aforementioned curing step almost all, i.e. about 98% of the halogenated polyamic acid is imidized. A post-cure heating at about 288° C. to about 357° C. for about 1.5 to about 4 hours, preferably at about 315° C. for about 2 hours generally follows the aforementioned cure step to produce a layer of the modified polyimide. The post-curing step increases the molecular weight of the modified polyimide. The temperature is ramped from the cure temperature to the post-cure temperature in about 20 to about 40 minutes, preferably in about 30 minutes.

A layer of the modified halogenated polyimide can be disposed on the surfaces of desired substrates, such as those of polyimide and epoxy resins as well as other materials, such as carbon fibers, graphite, aluminum, copper, titanium, INCONEL, steel, nickel, chromium and glass.

After the aforementioned curing step, the modified halogenated polyimide can be degreased with a conventional environmentally safe degreasing agent such as detergent, or a suitable organic solvent. As used thereinafter, the term "degreased" means a modified halogenated polyimide substrate having its surface free of oil, molding compounds, finger prints or extraneous material.

After the modified halogenated polyimide surface is degreased, it is subjected to an oxidation step. The surface is oxidized for effective time and at effective temperature with an oxiding agent of effective concentration. During the aforementioned oxidation step, the modified halogenated polyimide surface is treated by immersion, spraying, painting, or other forms of surface treatment with the oxidizing agent. Typical oxidizing agents used in the present invention include aqueous solutions of alkali metal dichromate and sulfuric acid, of ammonium dichromate and sulfuric acid, of alkali metal permanganate and alkali metal hydroxide, of cerium sulfate and sulfuric acid and of hydrogen peroxide.

In the preferred embodiment of the present invention, the surface of the degreased modified halogenated polyimide is immersed in an aqueous solution of an alkali metal hydroxide and alkali metal permanganate at a temperature of about 25° C. to 85° C., preferably at about 40° C., for a period of 2 to 20 minutes, preferably at about 2.5 minutes. The permanganate oxidizing solution can contain from about 1 gram to 30 grams of potassium permanganate per liter of solution, preferably about 3 grams to about 5 grams per liter, and about 3 grams to about 60 grams of sodium hydroxide per liter of solution, preferably about 5 grams to about 10 grams per liter. For effective results the substrate can then be removed from the bath for a water rinse. The rinse can be effected by immersing the treated substrate in water, or by spraying or brushing. The alkali metal permanganate preferably is potassium or sodium permanganate.

A residual film of varying thicknesses may be formed on the modified halogenated polyimide surface during the aforementioned oxidizing step. This film is formed in all the instances except when hydrogen peroxide or cerium sulfate is used as the oxidizing agent. The film may remain on the surface of the modified halogenated polyimide even after rinsing. Such a film may be removed by contacting the surface with a mild reducing agent such as an aqueous solution of about 1% to about 10% by weight of stannous chloride in about 5% by weight of hydrochloric acid, an aqueous solution of about 10% to about 30% by weight of hydrogen peroxide in about 5% by weight of sulfuric acid or ammonium hydroxide, Shipley Circuposit® MLB neutralizer 216, an aqueous solution of about 1% to about 30% by weight of sodium bisulfite in about 5% by weight of sulfuric acid or an aqueous solution of about 1% to about 10% by weight of hydroxylamine hydrochloride at a temperature of about 50° C. Preferably the film is contacted with Shipley Circuposit® MLB neutralizer 216 bath maintained at about 48° C. to about 50° C. for about 4 minutes. The mild reducing agents disclosed in U.S. Pat. No. 4,515,829 to Deckert et al. are incorporated herein by reference. The aforementioned reducing agents are strong enough to dissolve $MnO_2$ film but are mild enough to have little effect on the makeup of the cleaned and oxidized modified halogenated polyimide surface.

During the oxidizing step the molecules disposed along the surface are oxidized. The presence of oxidized molecules along the modified halogenated polyimide surface has been confirmed by chemical element analysis. The surface was chemically analyzed to a depth of 50 Å by means of X-ray photoelectron spectroscopy. It was determined that,
1) there was increase in oxygen level,
2) some of the carbon backbone (C—C, C═C, C—H) functionalities were oxidized, and
3) that there was increase in C—O— functionality.

As used hereinabove "effective time, temperature and concentration" relate to a period of duration, degrees of temperature and concentration respectively required to achieve a sufficient level of oxidizing necessary to produce a desired result on the surface and those skilled in the art will readily realize that by manipulating the concentrations and the temperatures of the various aforementioned reagents used in the present invention, the time of contact may be optimized for particular processing conditions. For example a modified halogenated polyimide surface in the form of an EMI enclosure may be contacted for cosmetic reasons on the inner or hidden walls or surfaces of the enclosure. The aforementioned methods of contacting the surface with the reagents are well known in the art.

Activation of the modified halogenated polyimide substrate for plating purposes can be achieved by well known methods of the art. For example, the substrate may be contacted with an acid solution of a precious metal, such as palladium chloride in hydrochloric acid, for a period of time sufficient to cause catalytic activation of the substrate surface. Activation and plating processes suitable for the present invention are described in W. T. Grubb et al, European No. EP 272,420, incorporated herein by reference, as well as in U.S. Pat. Nos. 3,011,920 and 3,841,881, issued to Shipley and Feldstein et al, respectively, both of which are also incorporated herein by reference. A water rinse generally follows the activation step.

After surface activation and rinsing, electroless plating can be undertaken. Illustrative metals used to form the metallization layer include copper, palladium, nickel, cobalt, gold, and various combinations thereof. The term "combinations" is defined to mean multiple layers of various metals deposited on the modified halogenated polyimide surface in any desired order. Electroless baths are well-known in the art and are generally described in the *Kirk-Othmer Encyclopedia of Chemical Technology*, 3rd Edition, Volume 8, the contents of which are incorporated herein by reference.

The modified halogenated polyimide surface can be subjected to a heat treatment after electroless deposition of the metal. Oven heating of the entire article, i.e., substrate with metal thereon, is sufficient, although any heating method is suitable. The temperature at which the heat treatment is carried out depends upon the metal that was electrolessly deposited. For example, the heat treatment temperature for an electrolessly deposited copper layer varies from about 100° C. to about 232° C., preferably about 148° C. and the heat treatment temperature for an electrolessly deposited nickel layer varies from about 100° C. to about 343° C., preferably about 204° C. Typically, this heat treatment is carried out for about 30 minutes to about 48 hours, with higher temperatures within the above range generally compensating for shorter duration, and vice versa. The heat treatment duration of about 8 hours is preferred. Although the mechanism is not understood, the heat treatment appears to reduce the time required to attain optimal adhesion.

If another layer of metal is to be applied on the surface, e.g., by electroplating, the above-described heat treatment can in some instances be omitted if a heat treatment is employed after the final plating step, as described below. However, preferred embodiments include the heat treatment prior to deposition of the additional metal layers.

Though electroless plating is the preferred application method for the second metal layer, electroplating may be also used. Electroplating baths are well-known in the art and are described, for example, in U.S. Pat. No. 4,555,315, incorporated herein by reference, although the particular electroplating bath used is not critical to the present invention. The choice of course depends in part on the particular metal being deposited. Suitable metals include those described for the electroless deposition. A description of baths for plating copper or various other metals is given in the Kirk-Othmer reference described above, in Vol. 8, beginning on page 826. The thickness of this second metal layer will of course depend upon the desired end use of the metal-coated substrate.

A heat treatment may be utilized at this stage. A typical heating regimen would be about 15 minutes to about 20 hours at about 45° C. to about 120° C.

A smooth surface can be achieved by the deposition of a second electrolytic layer, which contains chemical additives, on top of the first electrolytic layer. The bath used to apply this layer is sometimes referred to herein as an "additive" bath.

After deposition of the second electrolytic layer, the substrate is rinsed again with water and then heat treated to further enhance adhesion of the metal layers to the substrate. A typical heat treatment for this step, as stated earlier, can involve temperatures ranging from about 45° C. to about 120° C. for a time period ranging from about 15 minutes to about 20 hours.

The result of the second electrolytic deposition can be a smooth, bright metal layer characterized by a high level of adhesion of the modified halogenated polyimide substrate.

In preferred embodiments, an article prepared by the method of this invention usually has a first electrolessly applied metal layer which is about 0.25 micron to about 10 microns thick, preferably about 2 to 5 microns thick; a second electrolessly applied metal layer of at least about 5 microns; and a third, if so desired, electrolessly applied metal layer having a thickness of at least about 5 microns. However it should be noted that the present invention contemplates multiple layers of different metals and it should not be construed that the invention is restricted to just three or less metal layers.

An article prepared by the method of this invention comprises a modified halogenated polyimide surface having oxidized halogenated polyimide molecules disposed thereon and a metal layer disposed on such surface. The metal layer comprises an electrolessly applied primary layer on the treated surface. Additional secondary metal layers may be electrolessly or electrolytically applied on top of the primary metal layer until a desired thickness is attained. The present invention contemplates various combinations of metal layers such as a single copper layer, a primary copper layer followed by a secondary nickel layer or a primary nickel layer followed by a secondary copper layer and a tertiary nickel layer.

Articles of various embodiments prepared by the method of this invention are an insulated mold surface, an EMI shielded enclosures and modified polyimide coated optic fibers. The surfaces of the aforementioned articles have metallic layers deposited by a method disclosed herein.

An article of manufacture of the preferred embodiment is an insulated mold surface having modified halogenated polyimide surfaces chemically treated by the process of the present invention to improve electroless deposition of a first metal layer, preferably of nickel, thereon. Generally, the thickness of the modified halogenated polyimide layer, disposed on cores and/or cavities of a mold, typically made of steel, copper or aluminum is about 150 to about 500 microns, preferably about 250 microns. The first metal layer is preferably provided with about 5 microns thickness. A second metal layer of copper, preferably having thickness of about 1 to 2 microns, may be disposed on top of the first metal layer, the second layer being electrolessly or electrolytically applied on the first layer. As stated earlier, the second layer is preferably deposited by electroless metal deposition. A third metal layer of nickel, preferably having thickness of about 5 to 100 microns, may be disposed on top of the second metal layer, the third metal layer being electrolessly or electrolytically applied on the second layer.

Another article of manufacture of the present invention is an article such as, an EMI shielded enclosure, having modified halogenated polyimide surfaces chemically treated by the process of the present invention to improve electroless deposition of a first metal layer, preferably copper, thereon. Generally, the thickness of the halogenated polyimide layer, disposed on the sides of the walls of the EMI enclosure is about 10 to about 50 microns, preferably about 25 microns. A second metal layer preferably of nickel may be disposed on top of the first metal layer, the second layer being electrolessly or electrolytically applied on the first layer. As stated earlier, the second layer is preferably deposited by electroless metal deposition. Both the metal layers may be disposed, if so desired, on the interior sides of the walls of the enclosure. The combined thickness of the metal layers is adjusted to meet the desired requirements.

Another embodiment of the present invention is an article, such as an EMI shielded enclosure, having three metal layered EMI shields. Preferably the first layer is an electrolessly applied first nickel layer on the surfaces of the walls of the enclosure, the second layer being an electrolessly applied or electrolytically applied copper disposed on top of the first nickel layer and the third layer being an electrolessly applied or electrolytically applied second nickel layer disposed on top of the second layer.

In the examples to follow, adhesion of the metal to the substrate was evaluated by applying IPC-TM-650, Method 2.4.8.1 Peel test, issued by the Institute for Interconnecting and Packaging Electronic Circuits. Adhesion is generally measured as "peel strength", i.e. a force required to peel an adherent metal layer from an underlying substrate under controlled conditions. According to the aforementioned Peel Test, adhesion of the metal to the substrate is evaluated by measuring the force, in pounds per inch, necessary to peel ⅛th inch strips of the metal from the substrate surface. In the test, the ⅛th inch strips were prepared by a patterning technique using nitric acid as an etchant. The end of each metal strip was clipped to an AMETEK ® digital force measuring gage connected to a computer processor. The force values to lift the metal strips from the modified halogenated polyimide substrate were converted by the computer to pounds per inch peel values. Multiple peel values were obtained and then averaged for each plaque.

EXAMPLE 1

Two stainless steel plaques, that simulate an insulated mold surface, were abraded by grit blasting, washed with water to remove debris and dried. The dry plaque surfaces were then sprayed with a 6% by weight percent of EYMYD ® L-30N precursor resin solution dissolved in 20% by volume of dry N-methyl,2-pyrrolidone (NMP) intermixed in dry methylethylketone (MEK) to form a 10 mils layer of EYMYD ® resin. The first plaque was sprayed using dry air while the second plaque was accidentally sprayed using moist air. Following EYMYD ® resin coating, both samples were initially cured at 240° C. for 2 hours and then at 315° C. for additional 2 hours to produce fluorinated polyimide coated plaques. These plaques were then plated with an electroless nickel layer, followed by an electrolytically plated layer of copper having sufficient thickness for measuring the adhesion of the metal layer to the fluorinated polyimide layer. The specific preplating and plating conditions are shown below in Table 1:

TABLE 1

| Step | Procedure | Time (minutes) |
|---|---|---|
| 1 | clean in Micro solution | 30 |
| 2 | water rinse | 6 |
| 3 | Shipley Circuposit ® 213 Oxidizer | 15 |
| 4 | water rinse | 4 |

TABLE 1-continued

| Step | Procedure | Time (minutes) |
|---|---|---|
| 5 | Shipley Circuposit ® 216 Neutralizer | 4 |
| 6 | water rinse | 4 |
| 7 | Shipley Cataprep ® 404 catalyst preparation | 1 |
| 8 | Shipley Cataposit ® 44 catalyst solution | 5 |
| 9 | water rinse | 4 |
| 10 | Shipley Catalyst Accelerator ® 19 | 5 |
| 11 | water rinse | 4 |
| 12 | Enthone Enplate ® EN426 electroless Ni to 0.25 μm | 20 |
| 13 | water rinse | 4 |
| 14 | dry at 110° C. | 120 |
| 15 | electroplated Cu to 1.5 mils | 75 |
| 16 | water rinse | 4 |
| 17 | dry at 110° C. | 120 |

The plated sample plaques were striped with ⅛ inch wide strips of plater's tape and the remaining exposed metal layer was removed by concentrated $HNO_3$ to produce a series of copper lines on the surfaces of the plaques. One end of one of the copper line was peeled at a controlled rate and the force needed for its removal was measured to determine the peel adhesion under the aforementioned Peel test. A peel adhesion value of 3.8 pounds/inch was measured on the plaque sprayed with dry air and a peel adhesion value of 6.7 pounds/inch was measured on the plaque accidently sprayed with moist water.

EXAMPLE 2

The aforementioned procedure was used to spray coat, by using dry air, several stainless steel plaques with EYMYD ® L-30N precursor resin, except water in various quantities (weight percent of water per weight of polyamic acid) was added to the resin 5 minutes before the spraying step. The rest of the steps, such as curing and plating conditions, were identical for all sample plaques. The peel adhesion values of the electroless Nickel layer to the surface of the modified fluorinated polyimide are given in Table 2 below:

TABLE 2

| Quantity of water added (in % weight) | Nickel/polyimide adhesion in Pounds/inch |
|---|---|
| 0 (non-modified polyimide) | 3.3 |
| 0.4 (modified polyimide) | 3.8 |
| 2.0 (modified polyimide) | 4.5 |
| 4.0 (modified polyimide) | 5.2 |
| 8.0 (modified polyimide) | 6.1 |
| 20.0 not plateable due to poor coating quality | |

Sections of the plaque surface that had a non-modified polyimide layer and sections of the plaque surface that had a modified polyimide layer were submitted to the x-ray photoelectron spectroscopic analyses (XPS), performed on an x-ray photoelectron spectroscopic analyzer, model number SSX-100 made by Surface Science Instruments, Mountain View, Calif. and to the ATR infrared red spectroscopic analyses. Both of these analytical techniques appear to confirm the partial hydrolysis of the polyimide surface, shown in Table 3 below:

TABLE 3

| N 1s XPS Spectral Data* | |
|---|---|
| With $H_2O$ Added (modified polyimide) | Without $H_2O$ Added (non-modified polyimide) |
| 25% @ 399.2 eV (indicates presence of amide or amine) | 100% @ 400.4 eV (indicates presence of imide) |

TABLE 3-continued

| N 1s XPS Spectral Data* | |
|---|---|
| With $H_2O$ Added (modified polyimide) | Without $H_2O$ Added (non-modified polyimide) |
| 75% @ 400.4 eV (indicates presence of imide) | |

*N 1s spectral data refers to an energy in electron volts (eV) of 1s level electron of a nitrogen atom.

Additionally, the ATR spectra also showed that the modified polyimide molecules possess residual N-H character, thereby establishing the presence of amine group. The non-modified polyimide surface on the sample plaque contained no such group. Both of the aforementioned data suggest that water hydrolyzes the polyamic acid to form polyimide molecules terminated with an amine and a dicarboxylic acid group.

EXAMPLE 3

The aforementioned procedure was used to spray coat, by using dry air, several stainless steel plaques with a EYMYD ® L-30N precursor resin, except some of the plaques were spray coated with the EYMYD ® resin containing 4% by weight of water per weight of polyamic acid. Same curing conditions were followed for all the plaques.

Following the initial electroless nickel plating, the samples were heat treated for 2 hours at temperatures ranging from 110° C. to 200° C. before being electrolytically copper coated. The resulting metal/polyimide peel adhesion values are given below in Table 4.

TABLE 4

| Post plate heating Temperature (°C.) | Ni/polyimide Adhesion (pounds/inch) | |
|---|---|---|
| | (no $H_2O$ added) | ($H_2O$ added) |
| 110 | 2.8 | 4.6 |
| 150 | 3.7 | 5.3 |
| 175 | 4.5 | 6.7 |
| 200 | 4.8 | 7.6 |

EXAMPLE 4

Two steel mold inserts suitable for an injection mold were coated with modified and non-modified polyamic acid precursors using the aforementioned procedure to form the insulated mold surfaces. The first insert was spray coated with an EYMYD ® L-30N precursor resin (non-modified polyimide) while the second insert was coated with an EYMYD ® L-30N precursor resin to which 4% by weight of water per weight of polyamic acid had been added 15 minutes prior to the spraying operation (modified polyimide). Both samples were spray coated to a total thickness of 10 mils and then cured at 315° C. for 2 hours. An electroless nickel coating of 0.25 mils in thickness was applied to both inserts using the procedure outlined in Example 1. Both inserts were then used for molding samples made from 25% glass filled XENOY ® polycarbonate/butylene terephthalate alloy made by General Electric Company, at a melt temperature of 299° C. and a mold temperature of 115° C. The insulated mold surface of the first insert began to show signs of blistering, in particular around the mold gate area, following 50 shots and the insulated mold surface of the first insert delaminated after molding 173 shots. On the other hand, the insulated mold surface of the second insert, remained free from any delamination even after molding 500 shots.

What is claimed is:

1. A method of improving adhesion of a metal layer on a halogenated polyimide surface comprising:
   reacting a halogenated polyamic acid with about 0.1 to about 14.0% by weight of added water to form a reaction product;
   applying a coating of said reaction product over the surface of a substrate about 5 minutes to about 8 hours after adding said water;
   curing said reaction product coating into a layer of said halogenated polyimide;
   treating said surface of said polyimide layer with a degreasing agent; and
   treating said degreased surface with an oxidizing agent.

2. The method according to claim 1 wherein said reaction product layer is cured at about 205° C. to 250° C. for about 2 to 8 hours.

3. The method according to claim 2 wherein said curing step further comprises post-curing said reaction product layer at about 260° C. to 357° C. for about 1 to 24 hours.

4. The method according to claim 3 wherein temperature of said reaction product layer is ramped up from said cure temperature to said post-cure temperature in about 20 to about 40 minutes.

5. The method of claim 1 further comprising contacting said surface after said oxidation step with a mild reducing agent for a time sufficient to remove most of the oxidized residue produced during said oxidation of said surface.

6. The method of claim 5 wherein said reducing agent comprises an aqueous solution of stannous chloride and hydrochloric acid, of hydrogen peroxide and sulfuric acid or ammonium hydroxide, of sodium bisulfite and sulfuric acid, or of hydroxylamine hydrochloride.

7. The method of claim 1 wherein said oxidizing agent comprises an aqueous solution of alkali metal permanganate and alkali metal hydroxide, of alkali metal dichromate and sulfuric acid, of ammonium dichromate and sulfuric acid, of cerium bisulfate and sulfuric acid, of chromium trioxide and sulfuric acid, or of hydrogen peroxide.

8. The method of claim 1 wherein said halogenated polyamic acid comprises the following structure:

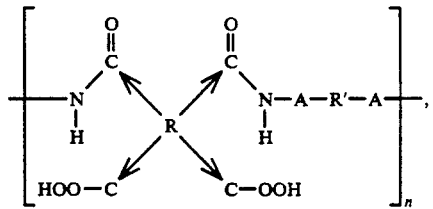

where R' is a halogenated alkyl group, A is a substituted or unsubstituted phenylene or diphenyl ether group, and R is an organic group of 5 to 50 carbon atoms.

9. The method of claim 8 wherein said organic group is selected from the group consisting of an unsubstituted aliphatic, halogen substituted aliphatic, alicyclic, aromatic, heteroaliphatic, heteroalicyclic, heteroaromatic radical and combinations thereof.

10. The method of claim 8 wherein R is a benzene or fused polynuclear ring.

11. The method of claim 8 wherein said halogenated alkyl group is fluorinated.

12. The method of claim 1 wherein said halogenated polyamic acid comprises the following structure:

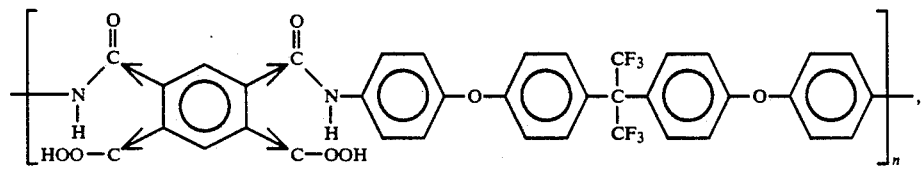

where n is an integer sufficient to provide a structure having an average molecular weight of at least 5000.

13. The method of claim 1 wherein said halogenated polyamic acid comprises the following structure:

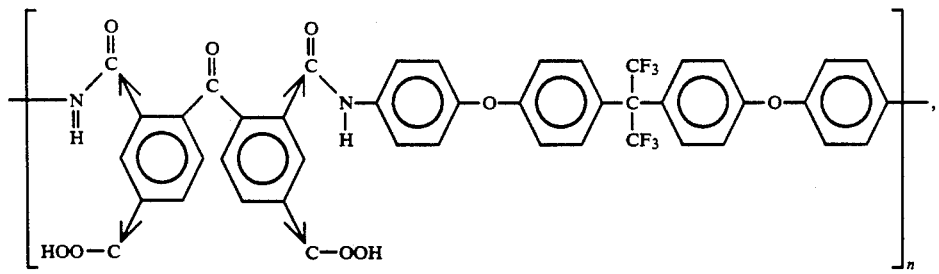

where n is an integer sufficient to provide a structure having an average molecular weight of at least 5000.

14. A method of metallizing a halogenated polyimide surface comprising:
   reacting a halogenated polyamic acid with about 0.1 to about 14.0% by weight of added water to form a reaction product;
   applying a coating of said reaction product over the surface of a substrate about 5 minutes to about 8 hours after adding said water;
   curing said reaction product coating into a cured layer;
   post-curing said cured layer into a layer of said halogenated polyimide;
   treating said surface of said modified polyimide layer with a degreasing agent;

treating said degreased surface with an oxidizing agent;

contacting said oxidized surface with a mild reducing agent for a time sufficient to remove most of the oxidized residue produced during said oxidation of said surface; and applying a metal layer on said cleaned surface.

15. The method of claim 14 wherein said step of applying said metal layer comprises:

electrolessly applying a primary metal layer on said cleaned surface; and electrolessly or electrolytically applying a secondary metal layer on top of said primary layer.

16. The method of claim 14 wherein said metal layer comprises copper, nickel, gold, silver, platinum, palladium, cobalt or a combination thereof.

17. The method of claim 14 wherein said metal layer comprises a copper layer in proximate contact with said surface followed by a nickel layer on top of said copper layer.

18. The method of claim 14 wherein said halogenated polyimide surface having said primary metal layer thereon is heat treated for about 30 minutes to about 48 hours, prior to applying said secondary metal layer on said primary layer.

19. The method of claim 14 wherein said halogenated polyimide surface is heat treated after applying said secondary metal layer on said primary layer at a temperature of about 45° C. to about 120° C. for about 15 minutes to about 20 hours.

20. A method of improving adhesion of a metal layer on a fluorinated polyimide surface comprising:

reacting a fluorinated polyamic acid with about 0.1 to about 14.0% by weight of added water to form a reaction product;

applying a coating of said reaction product over the surface of a substrate about 5 minutes to about 8 hours after adding said water;

curing said reaction product coating at about 205° C. to about 250° C. for about 2 to 8 hours to form a cured layer;

post-curing at about 260° C. to about 357° C. for about 1 hour to about 48 hours said cured layer into a layer of aid fluorinated polyimide;

treating said surface of said fluorinated polyimide layer with a degreasing agent;

oxidizing said degreased surface with an aqueous solution containing potassium permanganate and sodium hydroxide for about 2.5 minutes; and contacting said oxidized surface with an aqueous solution of a reducing agent for a time sufficient to remove most of the oxidized residue produced during said oxidation of said surface.

21. The method of claim 20 wherein said reducing agent is hydroxylamine hydrochloride.

22. The method of claim 20 wherein said aqueous solution contains about 3 to about 5 grams per liter of potassium permanganate and about 5 to about 10 grams per liter of sodium hydroxide.

* * * * *